United States Patent
Saegusa et al.

(10) Patent No.: US 6,370,033 B1
(45) Date of Patent: Apr. 9, 2002

(54) ELECTRONIC DEVICE HAVING PRINTED CIRCUIT BOARD JOINED TO CAVITY RESONANCE FILTER

(75) Inventors: Seiichiro Saegusa; Naoshi Nakamura, both of Tsurugashima (JP)

(73) Assignee: Toko Kabushiki Kaisha, Tokyo-To (JP)

( * ) Notice: Subject to any disclaimer, the term of this patent is extended or adjusted under 35 U.S.C. 154(b) by 0 days.

(21) Appl. No.: 09/496,423

(22) Filed: Feb. 2, 2000

(30) Foreign Application Priority Data

Feb. 2, 1999 (JP) .......................................... 11-024662

(51) Int. Cl.[7] ............................. H03H 7/01; H05K 7/06
(52) U.S. Cl. ...................... 361/777; 361/782; 361/814; 361/816; 174/35 CE; 333/185; 336/200
(58) Field of Search ............................... 361/782, 783, 361/814, 737, 818, 799, 800, 753, 816, 777; 333/185, 246, 247; 174/35 CE, 35 R; 336/200, 232

(56) References Cited

U.S. PATENT DOCUMENTS

| | | | | |
|---|---|---|---|---|
| 3,718,874 A | * | 2/1973 | Cooper, Jr. ................. | 336/200 |
| 5,036,301 A | * | 7/1991 | Takao et al. ................ | 333/185 |
| 5,497,137 A | * | 3/1996 | Fujiki ......................... | 336/200 |
| 5,618,777 A | * | 4/1997 | Hey-Shipton et al. ...... | 505/210 |
| 5,696,471 A | * | 12/1997 | Fugiwara ..................... | 336/200 |
| 5,752,182 A | * | 5/1998 | Nakatsuka et al. ......... | 333/247 |
| 6,097,273 A | * | 8/2000 | Frye et al. .................. | 336/200 |
| 6,175,727 B1 | * | 1/2001 | Mostov ....................... | 336/200 |
| 6,222,427 B1 | * | 4/2001 | Kato et al. .................. | 333/185 |

* cited by examiner

Primary Examiner—Jayprakash N. Gandhi
Assistant Examiner—John B. Vigushin
(74) Attorney, Agent, or Firm—Pillsbury Winthrop LLP

(57) ABSTRACT

An electronic device has a filter function, and enables a communications device to be miniaturized and made thin at reduced cost. A pair of spiral conductive patterns are provided adjacent to each other on a printed circuit board having multiple electronic elements provided thereon, and one end of each of the spiral conductive patterns connects via through holes to a ground pattern provided on the bottom face of the printed circuit board. Then, a cavity case is electrically connected to the ground pattern, and is mounted on the printed circuit board so as to cover the top faces of the spiral conductive patterns, thereby forming a cavity resonance filter joined to the printed circuit board.

7 Claims, 2 Drawing Sheets

ELECTRONIC DEVICE HAVING PRINTED CIRCUIT BOARD JOINED TO CAVITY RESONANCE FILTER

BACKGROUND OF THE INVENTION

1. Field of the Invention

The present invention relates to an electronic device for use at high frequencies comprising a printed circuit board joined to a cavity resonance filter, and having the functions of a filter used in a miniaturized radio communications device.

2. Description of the Related Art

In recent years, there has been remarkable development of radio communications devices, such as cordless telephones and mobile telephones. The miniaturized shape and moderate cost of such radio communications devices have been the primary factors behind their proliferation.

As is well known, various types of functional circuits and devices, such as an antenna, a filter, and an amplifier, are required to form a radio communications device. The functional circuits are provided on a printed circuit board, and various other devices are mounted on the printed circuit board to form a radio communications device.

Several filters, such as an antenna filter, an intermediate-frequency filter, and the like, are required to form a communications device, though their number, function (LP, HP, etc.) or position and the like differ according to the communications method used. For example, in the case of an antenna bandpass filter connected to an antenna, in recent communications devices, an individual component which fulfils a predetermined function, such as a surface acoustic wave filter or a ceramic filter, are used as the bandpass filter. This is because a surface acoustic wave filter, a ceramic filter, and the like, have frequency characteristics which are superior to conventional LC filters, and also have a miniaturized component shape. Consequently, when a surface acoustic wave filter or a ceramic filter is used, the communications device can be miniaturized.

By using surface acoustic wave filter, a ceramic filter, or the like, it is possible to miniturize the communications device more than when a conventional LC filter is used. However, a surface acoustic wave filter, a ceramic filter, or the like, usually comprises an independent electronic component (termed a discrete component) functioning as a filter, which is mounted on the printed circuit board and electrically connected to a wiring pattern thereon.

Since each discrete component must be purchased separately, and since filter-type discrete components are especially expensive, the manufacturing cost of the communications device is high. Furthermore, when discrete components are used, the size of the discrete components, and spaces and the like provided for mounting or soldering them on the printed circuit board, increase the size of the communications device, and make it difficult for the communications device to be miniaturized and made thin.

SUMMARY OF THE INVENTION

It is an object of the present invention to provide an electronic device having the function of a filter which enables a communications device to be miniaturized and made thin at low cost.

The electronic device of the present invention comprises a printed circuit board having multiple electronic elements mounted thereon; a ground pattern provided on the printed circuit board; a pair of spiral conductive patterns provided adjacent to each other on the printed circuit board, one end of each pattern connecting to the ground pattern; and a cavity case electrically connected to the ground pattern, and covering the top faces of the pair of spiral conductive patterns.

DESCRIPTION OF THE PREFERRED EMBODIMENTS

Two spiral conductive patterns are provided next to each other on a printed circuit board. One end of each of the spiral conductive patterns connects via first and second through holes to a ground pattern provided on the printed circuit board, and the other ends of the spiral conductive patterns are left open.

Third and fourth through holes are provided at predetermined positions in the spiral conductive patterns, and are connected to terminal patterns for inputting or outputting signals.

Then, a cavity case is mounted on the printed circuit board so as to cover the top faces of the two spiral conductive patterns. At this point, claws for securing on the cavity case enter fifth and sixth through holes provided on the printed circuit board, and secure the cavity case in position.

Figure 1:
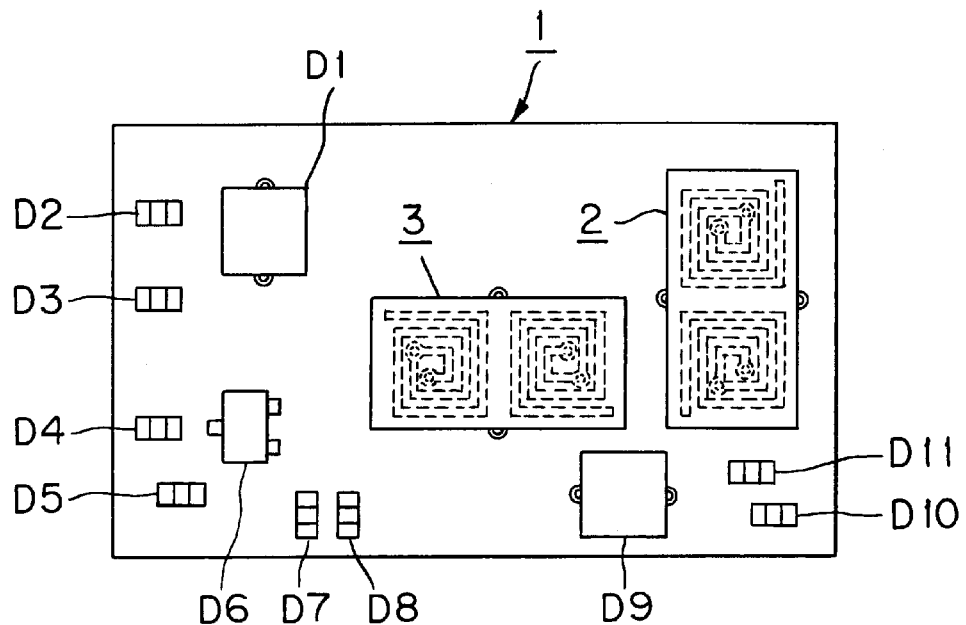
FIG. 1 is a top view of an electronic device according to the present invention.
Figure 2:
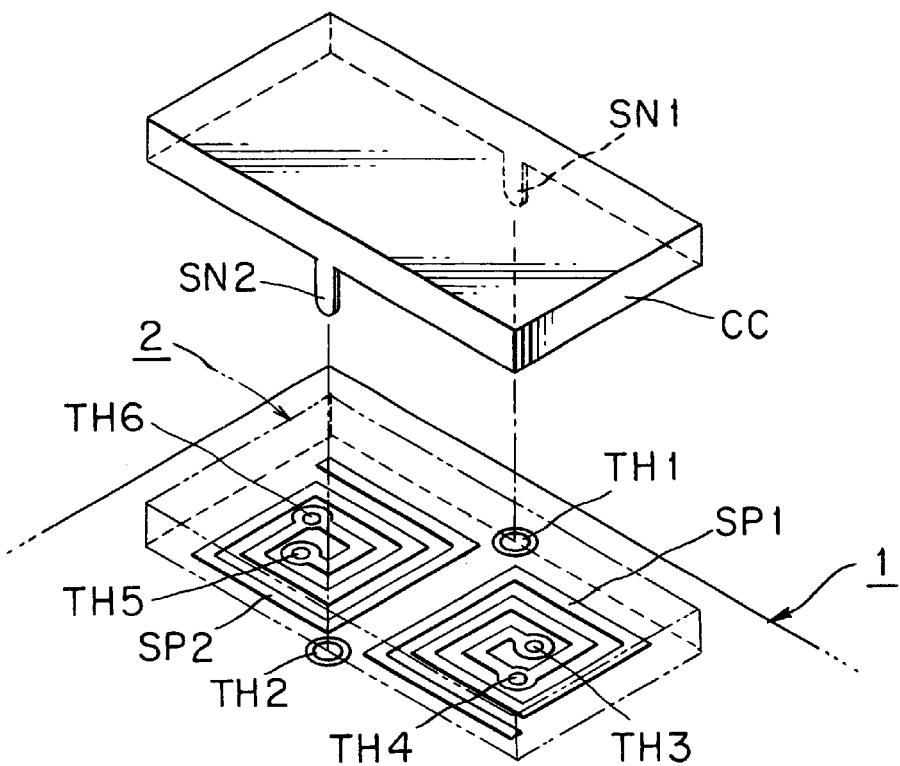
FIG. 2 is a perspective view of a cavity resonance filter portion of the electronic device according to the present invention.
Figure 3:
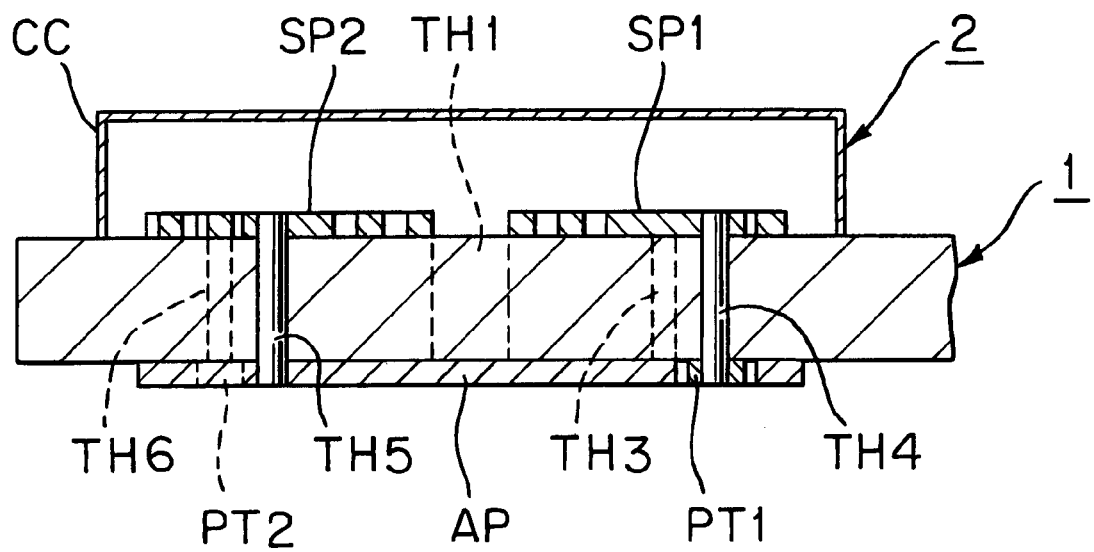
FIG. 3 is a cross-sectional view of a cavity resonance filter portion of the electronic device according to the present invention.

FIGS. 1 to 3 show an embodiment of the electronic device functioning as a filter according to the present invention for enabling a communications device to be miniaturized and made thin at lower cost. FIG. 1 is a top view of the electronic device, FIG. 2 is a perspective view of a cavity resonance filter portion, and FIG. 3 is a cross-sectional view of the cavity resonance filter portion.

The electronic device of the present invention shown in FIG. 1 forms, for example, a high-frequency circuit stage of a receiver portion in a specific miniaturized radio communications device, and comprises independent electronic elements D1 to D11 mounted on a printed circuit board 1, and cavity resonance filters 2 and 3, which are joined to the printed circuit board 1.

The cavity resonance filters 2 and 3 of the electronic device shown in FIG. 1 are formed by the following method.

As shown in FIG. 2, to form the cavity resonance filter 2, firstly, two spiral conductive patterns SP1 and SP2 are provided next to each other on the printed circuit board 1. As shown in FIGS. 2 and 3, ends of each of the spiral conductive patterns SP1 and SP2 (the end at the center of each spiral) are connected via through holes TH3 and TH5 respectively to a ground pattern AP provided on the bottom face of the printed circuit board 1. Here, the two spiral conductive patterns SP1 and SP2 and the ground pattern AP are provided at opposing positions on either side of the printed circuit board 1. On the other hand, the other ends of the spiral conductive patterns SP1 and SP2 (the end of the outer side of each spiral) are left open.

Through holes TH4 and TH6 are provided at predetermined positions in the spiral conductive patterns SP1 and SP2. Here, terminal patterns PT1 and PT2 for inputting and outputting signals are provided on the bottom face of the printed circuit board 1, the spiral conductive pattern SP1 connecting via the through hole TH4 to the terminal pattern TP1, and the spiral conductive pattern SP2 connecting via the through hole TH6 to the terminal pattern TP2.

Then, a cavity case CC is mounted on the printed circuit board 1, and covers the top faces of the two spiral conductive patterns SP1 and SP2. At this time, claws for securing SN1 and SN2 of the cavity case CC are inserted into the through holes TH1 and TH2, securing the cavity case CC to the printed circuit board 1, and simultaneously, the cavity case CC is electrically connected to the ground pattern AP.

Figure 4:
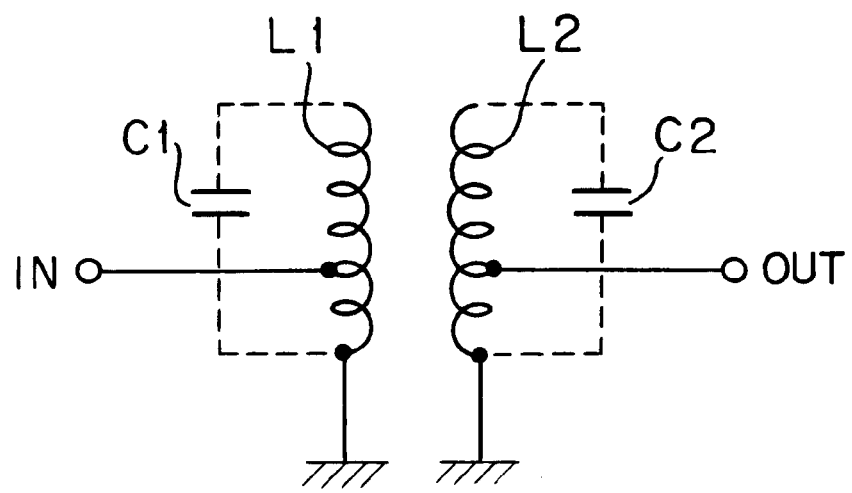
FIG. 4 is an equivalent circuit diagram of a cavity resonance filter.

The cavity resonance filter 2 of this constitution forms a filter circuit as shown in the equivalent circuit of FIG. 4. As shown in FIG. 4, the spiral conductive patterns SP1 and SP2 form two inductances L1 and L2. Ends of each of the two inductances L1 and L2 connect via the through holes TH3 and TH5 respectively to the ground pattern AP, i.e. to ground (GND). The inductances L1 and L2 connect at predetermined positions via the through holes TH4 and TH6 to a signal input terminal IN and a signal output terminal OUT respectively. Here, the signal input terminal IN and the signal output terminal OUT of FIG. 4 correspond respectively to the terminal patterns PT1 and PT2 shown in FIG. 3. Then, stray capacities are produced between the spiral conductive patterns SP1 and SP2 and the ground pattern AP, and between the spiral conductive patterns SP1 and SP2 and the cavity case CC, thereby creating capacitance elements C1 and C2 at positions in the circuit such as those shown in FIG. 4.

In the electronic device of the present invention comprising a cavity resonance filter joined to a printed circuit board, the spiral conductive patterns SP1 and SP2 and the through holes TH1 to TH6, which form the cavity resonance filter 2, can be manufactured simultaneously to the manufacture of the printed circuit board 1. Consequently, the component costs and manufacturing costs are lower than when discrete components are used to form the filter, enabling the cost of the communications device to be reduced.

Furthermore, since the printed circuit board 1 is joined in a single body to the substrate of the cavity resonance filter 2, there is no need to provide a terminal for connection on the cavity resonance filter 2, or to provide spaces and pads for soldering on the printed circuit board 1. Consequently, since the height of the cavity resonance filter 2 can be reduced, and it is no longer necessary to provide extra space on the printed circuit board 1, the communications device can be miniaturized and made thin.

The structure and characteristics of the cavity resonance filter 3 are the same as those of the cavity resonance filter 2 described above, and will not be explained here.

In the embodiment of the electronic device according to the present invention described above, a two-layered printed circuit board is used as the printed circuit board 1 formed together with the cavity resonance filters 2 and 3, but a single-layer board or a multilayered board having three or more layers may alternatively be used. Furthermore, according to the electronic device of the present embodiment, only two cavity resonance filters are joined to the printed circuit board, but it is acceptable to use just one cavity resonance filter, or three or more.

Moreover, the cavity case used to form the cavity resonance filters does not have to be provided separately for each cavity resonance filter portion as in the embodiment of the present invention, and alternatively, multiple pairs of spiral conductive patterns may be covered by a single large cavity case. In such an arrangement, an object for covering the portion of a printed circuit board comprising spiral conductive patterns, such as a case for containing a printed circuit board, or a shield plate provided on a printed circuit board for preventing noise, may for example be used as the cavity case. Various modifications which fall within the spirit and scope of the invention can of course be made.

As described above, according to the electronic device of the present invention, two spiral conductive patterns are provided adjacent to each other on a printed circuit board having multiple electronic elements provided thereon, and one end of each of the spiral conductive patterns connects to a ground pattern. Then, a cavity case is electrically connected to the ground pattern, and is mounted on the printed circuit board so as to cover the top face of the spiral conductive patterns, thereby forming a cavity resonance filter joined to the printed circuit board.

According to the electronic device of the present invention, the costs of components and manufacturing can be made more inexpensive than when discrete components are used to form the filter. Furthermore, since the height of the cavity resonance filter itself can be reduced, there is no need to provide extra space for soldering and the like on the printed circuit board. As a consequence, a communications device using the electronic device of the present invention can be miniaturized and made thin, and its cost can be reduced.

What is claimed is:

1. An electronic device comprising:

a printed circuit board having multiple electronic elements mounted thereon;

a ground pattern provided on said printed circuit board;

a pair of spiral conductive patterns provided adjacent to each other on said printed circuit board, one end of each pattern connecting to said ground pattern and the other end being open ended; and a cavity case electrically connected to said ground pattern, and provided so as to cover the top faces of said pair of spiral conductive patterns.

2. The electronic device of claim 1, wherein said pair of spiral conductive patterns has an input or output terminal at an intermediate part thereof.

3. The electronic device of claim 1, wherein said cavity case is configured to create a capacitance with said spiral conductive patterns.

4. An electronic device comprising:

a printed circuit board having multiple electronic elements mounted thereon;

a ground pattern provided on a first face of said printed circuit board;

a pair of spiral conductive patterns provided adjacent to each other at a predetermined position on a second face of said printed circuit board so as to be facing said ground pattern with said printed circuit board there between, one end of each of said spiral conductive patterns connecting via a through hole to said ground pattern; and a cavity case electrically connected to said ground pattern, and provided so as to cover the top faces of said pair of spiral conductive patterns.

5. The electronic device of claim 4, wherein said pair of spiral conductive patterns are provided adjacent to each other on said printed circuit board, one end of each pattern connected to said ground pattern and the other end being open-ended.

6. The electronic device of claim 4, wherein said pair of spiral conductive patterns has an input or output terminal at an intermediate part thereof.

7. The electronic device of claim 4, wherein said cavity case is configured to create a capacitance with said spiral conductive patterns.

* * * * *